US011239050B2

United States Patent
Maehara et al.

(10) Patent No.: US 11,239,050 B2
(45) Date of Patent: Feb. 1, 2022

(54) IMAGING DEVICE

(71) Applicant: Hitachi High-Tech Corporation, Tokyo (JP)

(72) Inventors: Miku Maehara, Tokyo (JP); Shigeru Kawamata, Tokyo (JP); Yoshinobu Hoshino, Tokyo (JP); Hiroyuki Chiba, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/756,224

(22) PCT Filed: Oct. 16, 2017

(86) PCT No.: PCT/JP2017/037369
§ 371 (c)(1),
(2) Date: Apr. 15, 2020

(87) PCT Pub. No.: WO2019/077650
PCT Pub. Date: Apr. 25, 2019

(65) Prior Publication Data
US 2021/0193432 A1    Jun. 24, 2021

(51) Int. Cl.
*H01J 37/26*    (2006.01)
(52) U.S. Cl.
CPC .................. *H01J 37/265* (2013.01)
(58) Field of Classification Search
CPC .......... H01J 37/00; H01J 37/02; H01J 37/265; H01J 37/22; H01J 37/222; H01J 37/26; H01J 37/28

USPC ................. 250/306, 307, 310, 311
See application file for complete search history.

(56) References Cited

U.S. PATENT DOCUMENTS

| 5,917,469 A | 6/1999 | Matsushita |
| 6,262,731 B1* | 7/2001 | Hasegawa ........... G06F 16/9562 715/764 |
| 2012/0140999 A1 | 6/2012 | Kishima |
| 2013/0146763 A1* | 6/2013 | Kawada ................. G01B 15/00 250/306 |

(Continued)

FOREIGN PATENT DOCUMENTS

| JP | 5-298417 A | 11/1993 |
| JP | 2009-42462 A | 2/2009 |

(Continued)

OTHER PUBLICATIONS

International Search Report (PCT/ISA/210) issued in PCT Application No. PCT/JP2017/037369 dated Jan. 9, 2018 with English translation (four (4) pages).

(Continued)

*Primary Examiner* — Jason L McCormack
(74) *Attorney, Agent, or Firm* — Crowell & Moring LLP

(57) ABSTRACT

An object of the invention is to easily acquire an image of a position corresponding between each section in an imaging device that acquires an image of a plurality of sample sections. The imaging device according to the invention calculates, according to a correspondence relationship between a characteristic point and a first observation region in a first sample section, coordinates of a second observation region of a second sample section, and generates an observation image at the calculated coordinates (see FIG. 7B).

17 Claims, 12 Drawing Sheets

(56) References Cited

U.S. PATENT DOCUMENTS

2013/0194312 A1  8/2013  Yoshioka et al.
2017/0011511 A1  1/2017  Goodman et al.

FOREIGN PATENT DOCUMENTS

| JP | 2012-118448 A | 6/2012 |
| JP | 2013-45069 A | 3/2013 |
| JP | 2013-246187 A | 12/2013 |
| JP | 2013-257282 A | 12/2013 |
| JP | 2017-21028 A | 1/2017 |

OTHER PUBLICATIONS

Japanese-language Written Opinion (PCT/ISA/237) issued in PCT Application No. PCT/JP2017/037369 dated Jan. 9, 2018 (five (5) pages).

\* cited by examiner

IMAGING DEVICE

TECHNICAL FIELD

The present invention relates to an imaging device.

BACKGROUND ART

There is a technique for superimposing images of a plurality of tissue sections. PTL 1 discloses a method of obtaining an image for which position alignment is performed by an image alignment device. Patent Document 1 discloses a technique for performing position alignment by using a radiation image of a stimulable phosphor sheet of a rat brain section, selecting two images for which the position alignment is performed, extracting an outline of the brain section, and extracting relatively prominent points as characteristic points.

CITATION LIST

Patent Literature

PTL 1: JP-A-5-298417

SUMMARY OF INVENTION

Technical Problem

When observing a plurality of sample sections, generally the same position of each section may be observed. For example, when observing a state of a sample at each depth along a depth direction of the sample, in some cases, a plurality of sample sections are created by slicing the sample along a horizontal plane, and the same position of each sample section is observed. In order to specify a position corresponding between each section, for example, characteristic points of each section may be specified on an observation image separately, and the characteristic points may be associated between the sections. This is because the corresponding characteristic points are assumed to exist at substantially the same position. When observing each of the sample sections, for example, a charged particle beam device such as a scanning electron microscope or an optical microscope is used.

The charged particle beam device or an optical microscope can observe a sample at a high magnification, but on the other hand, a field of view is narrow because of the high magnification. Therefore, in the case of observing a sample at a high magnification, when observing substantially the same position of each section as described above, it may be difficult to specify a corresponding portion between the sections.

The invention has been made in view of the above-described problems, and an object of the invention is to easily acquire an image of a position corresponding between each section in an imaging device that acquires an image of a plurality of sample sections.

Solution to Problem

An imaging device according to the invention calculates, according to a correspondence relationship between a characteristic point and a first observation region in a first sample section, coordinates of a second observation region of a second sample section, and generates an observation image at the calculated coordinates.

Advantageous Effect

According to the imaging device of the invention, an image of a position corresponding between each section can be easily acquired at the time of acquiring images of a plurality of sample sections.

DESCRIPTION OF EMBODIMENTS

First Embodiment

Figure 1:
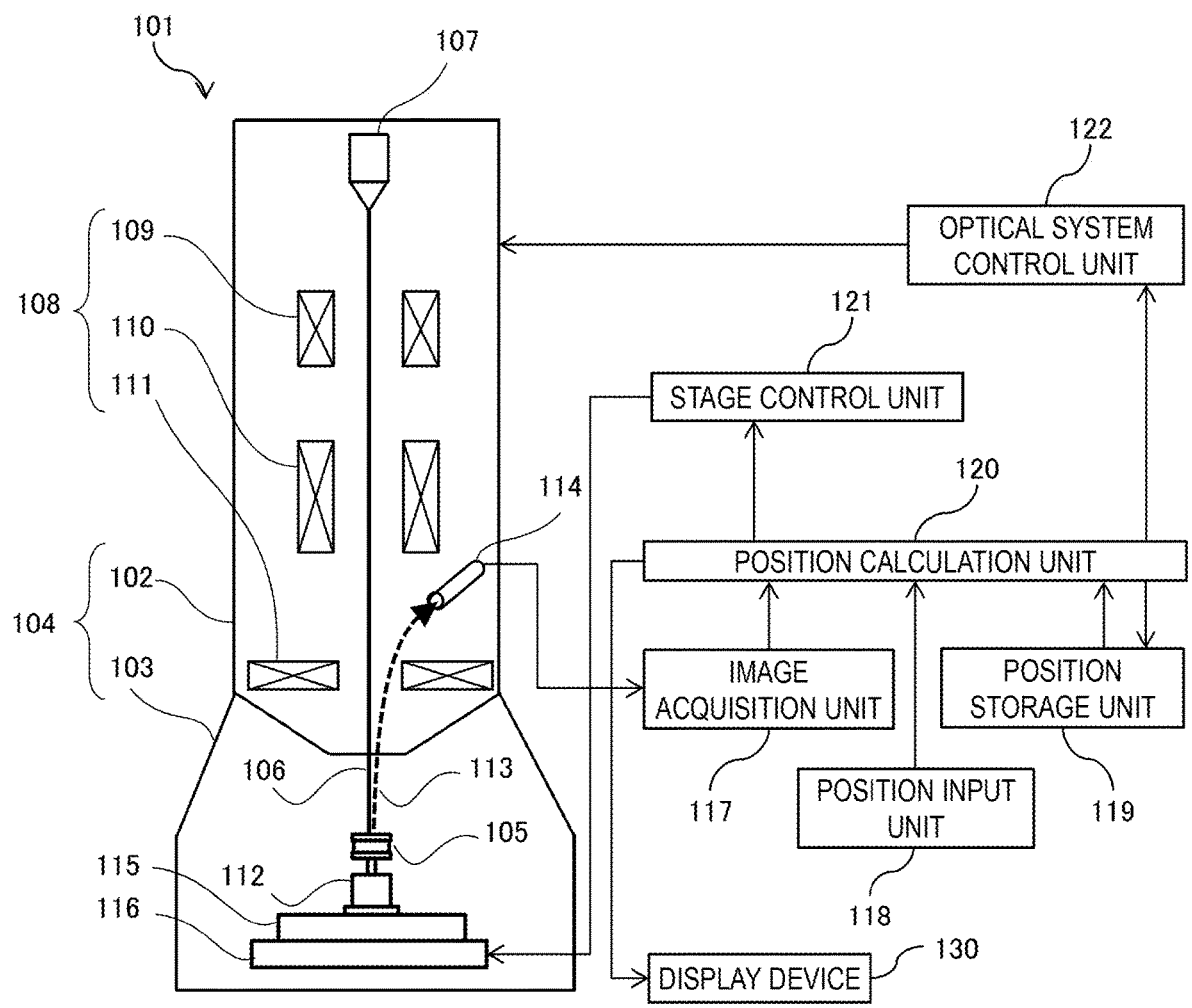
FIG. 1 is a configuration diagram of a charged particle beam device 101 according to a first embodiment.

FIG. 1 is a configuration diagram of a charged particle beam device 101 according to a first embodiment. In the first embodiment, the charged particle beam device 101 is a scanning electron microscope. The charged particle beam device 101 is configured as a scanning electron microscope capable of capturing an observation image of a sample. The charged particle beam device 101 includes a device main body 104 and a controller. The device main body 104 is configured such that a lens barrel 102 and a sample chamber 103 are integrated. The device main body 104 operates as an imaging unit that images an image of the continuous section sample 105. The controller includes an image acquisition unit 117, a position input unit 118, a position storage unit 119, a position calculation unit 120, a stage control unit 121, an optical system control unit 122, and a display device 130, which will be described later.

The lens barrel 102 includes an electron gun 107 and an electron optical system 108. The electron gun 107 emits an electron beam 106. The electron optical system 108 controls a trajectory of the electron beam 106. The electron optical system 108 includes a condenser lens 109, a deflector 110, and an objective lens 111. The condenser lens 109 converges the electron beam 106 emitted from the electron gun 107. The deflector 110 scans with the electron beam 106. The objective lens 111 converges the electron beam 106 so that the electron beam 106 is focused on a surface of the continuous section sample 105.

By emitting the electron beam 106 to the continuous section sample 105, a signal 113 (for example, secondary electrons or reflected electrons) is generated. A detector 114 is disposed at an appropriate position in the lens barrel 102 or the sample chamber 103, and detects the signal 113.

The sample chamber 103 has a structure in which a sample table 112 is accommodated through a leading-in or leading-out port (not shown) that can be opened and closed. The continuous section sample 105 is placed on the sample table 112. The sample chamber 103 further includes a sample stage 115 on which the sample table 112 is placed.

The sample stage 115 includes a stage control device 116. The stage control device 116 moves or rotates the continuous section sample 105 in, for example, a horizontal plane and a direction perpendicular to the plane in the sample chamber 103, thereby displacing a position and an orientation of the continuous section sample 105 in the sample chamber 103. The stage control device 116 is controlled by the stage control unit 121, and the electron optical system 108 is controlled by the optical system control unit 122. The electron beam 106 is emitted to any desired position of the continuous section sample 105, and the generated signal 113 is detected by the detector 114, so that any desired position of the continuous section sample 105 can be observed at any magnification.

The image acquisition unit 117 converts the signal 113 detected by the detector 114 into observation image (hereinafter, referred to as electron microscope image) data. The image acquisition unit 117 transfers the electron microscope image data to the position calculation unit 120. The position calculation unit 120 is configured with an information processing device such as a computer. The position calculation unit 120 performs a calculation described later using information input from the position input unit 118 and information stored in the position storage unit 119. The stage control unit 121 and the optical system control unit 122 control the stage control device 116 and the electron optical system 108 respectively, using calculation results of the position calculation unit 120.

The display device 130 is, for example, a screen display device such as a display device, and displays an observation image of the continuous section sample 105 acquired by the image acquisition unit 117 on a screen. The display device 130 also displays a screen interface described later with reference to FIG. 5 and subsequent drawings. The position input unit 118 receives a specified input which is input with the screen interface.

Figure 2:
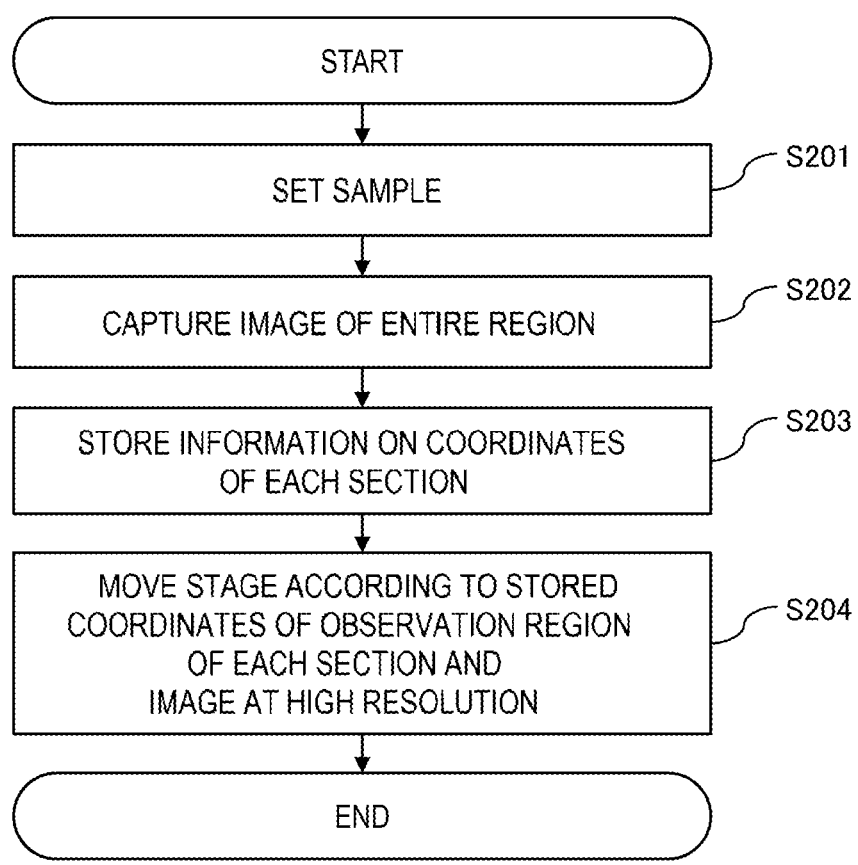
FIG. 2 is a flowchart showing a procedure for imaging a continuous section sample 105 using the charged particle beam device 101.

FIG. 2 is a flowchart showing a procedure for imaging the continuous section sample 105 using the charged particle beam device 101. Hereinafter, each step of FIG. 2 will be described.

(FIG. 2: Steps S201 and S202)

A user places the continuous section sample 105 on the sample table 112, and places the sample table 112 on the sample stage 115 (S201). The user uses the charged particle beam device 101 to image an entire region 301 described later with reference to FIG. 3 (S202).

(FIG. 2: Step S203)

The position calculation unit 120 calculates coordinates of an observation region (a high-magnification region 304 described later with reference to FIG. 3) in each sample section according to a flowchart shown in FIG. 4 described later. The position storage unit 119 stores the coordinates of each observation region obtained by the position calculation unit 120. When the observation region is rotated between the sample sections, rotation angles may be obtained together and stored.

(FIG. 2: Step S204)

The stage control unit 121 moves the sample stage 115 to a position where an image of each observation region can be acquired according to the coordinates of each observation region stored in the position storage unit 119. Similarly, the optical system control unit 122 controls the electron optical system 108 according to the coordinates of each observation region stored in the position storage unit 119 so that the electron beam 106 is emitted to a position corresponding to each observation region. The image acquisition unit 117 acquires images of a medium-magnification region 303 and the high-magnification region 304 described later with reference to FIG. 3 in the observation region. After these images are acquired, each image can be observed using the screen interface described later with reference to FIG. 5.

Figure 3:
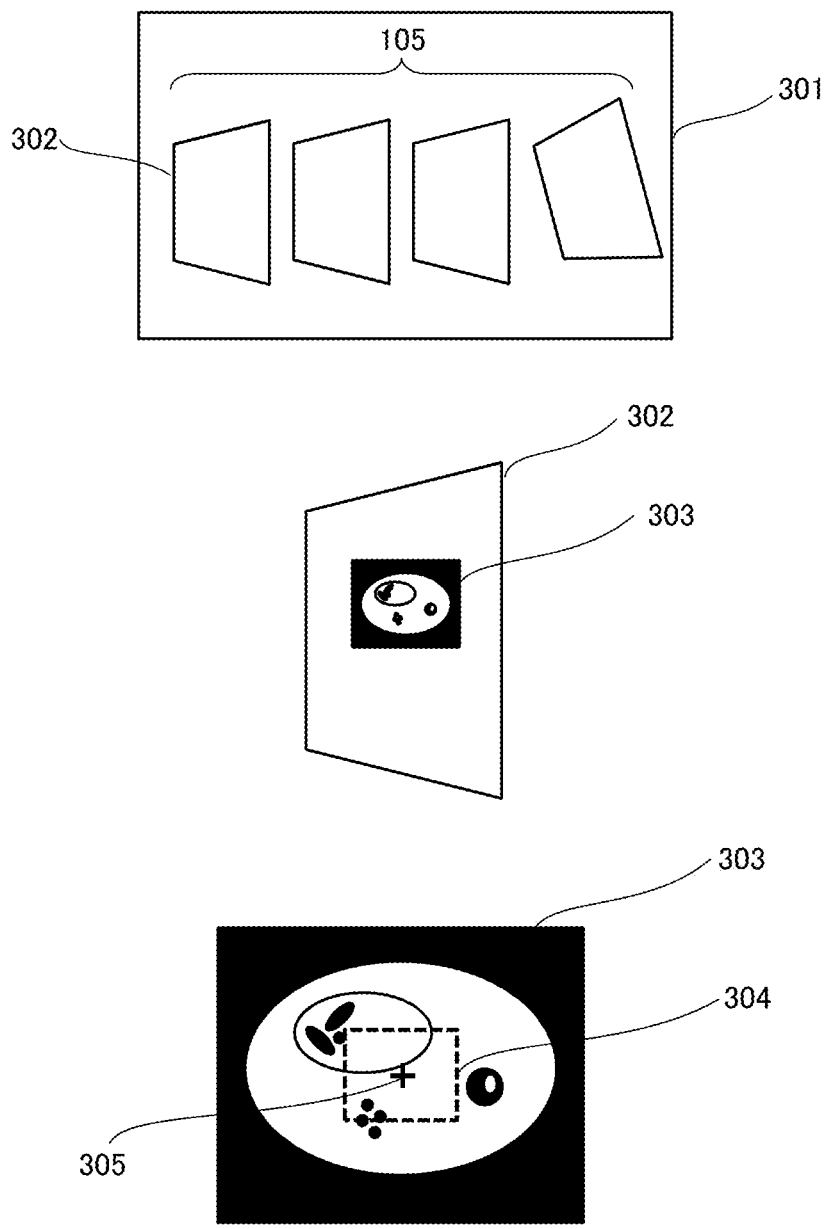
FIG. 3 is an example of the continuous section sample 105 and an observation region.

FIG. 3 is an example of the continuous section sample 105 and the observation region. The continuous section sample 105 is a sample in which a plurality of sections 302 is continuously arranged. It is assumed that each section has substantially the same shape. An example in which the shape is different will be described later. It is assumed that the user observes substantially the same position of each section at a high magnification.

The entire region 301 is used for the user to visually recognize an arrangement and the number of the sections 302. In step S202, the user visually recognizes the arrangement and the number of the sections 302 by capturing an image of the entire region 301.

The high-magnification region 304 is a region that the user intends to observe. High-magnification region coordinates 305 are the coordinates of the high-magnification region 304. The high-magnification region coordinates 305 are, for example, center coordinates of the high-magnification region 304. If the high-magnification region 304 can be specified, other coordinates (for example, coordinates of each vertex of a rectangular region) may be used as the high-magnification region coordinates 305.

The medium-magnification region 303 is an image captured at a magnification between a magnification of the entire region 301 and a magnification of the high-magnification region 304. When the user specifies the high-magnification region 304, a part to be observed by the user needs to be included in the high-magnification region 304. Therefore, the medium-magnification region 303 can be used to grasp characteristics included in the high-magnification region 304 to a certain extent. Specifically, when the user specifies the observation region in step S203, an image of the medium-magnification region 303 can be captured to assist the specification.

Figure 4:
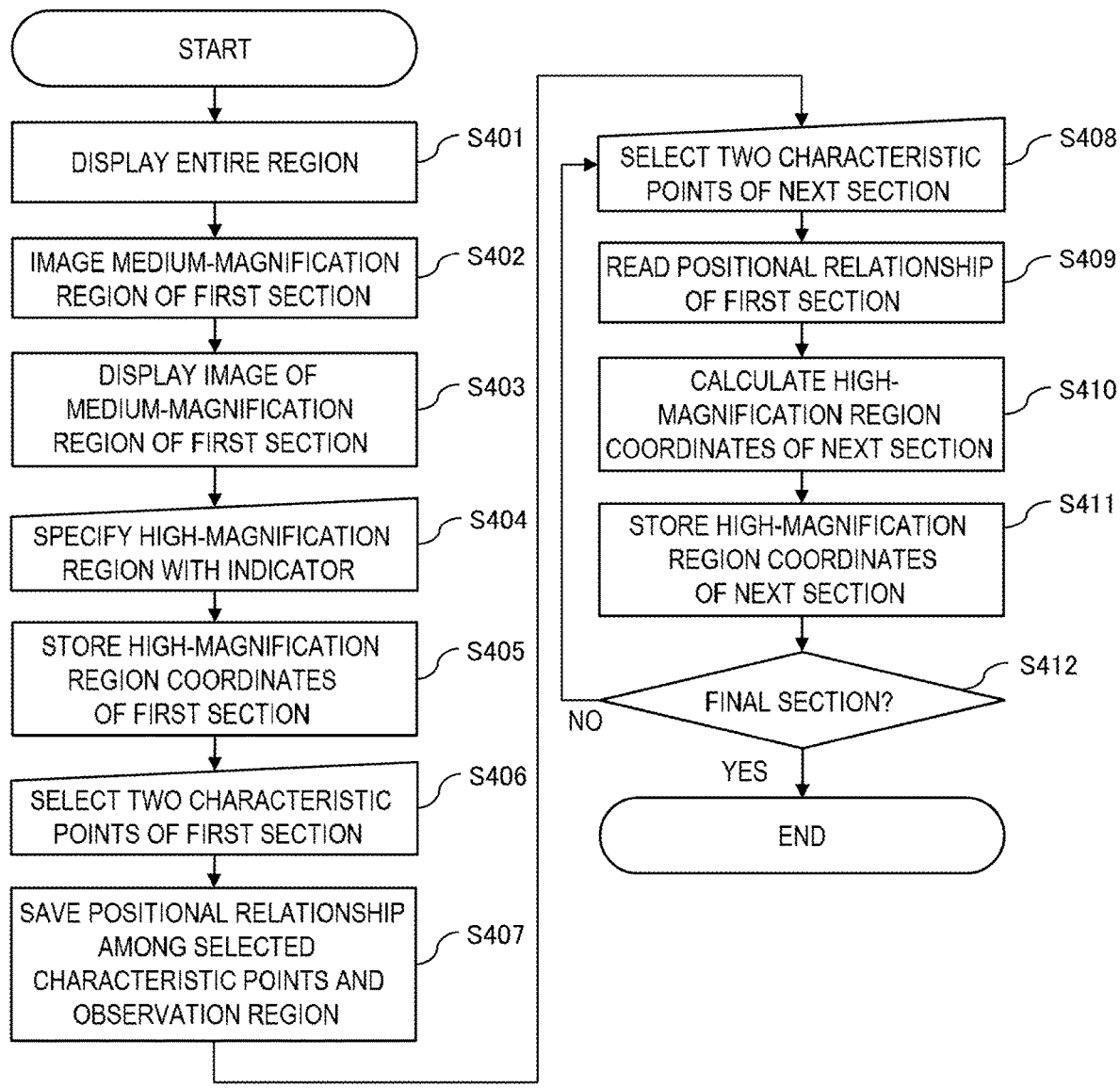
FIG. 4 is a flowchart showing details of step S203.

FIG. 4 is a flowchart showing details of step S203. Hereinafter, each step of FIG. 4 will be described.

(FIG. 4: Step S401)

The display device 130 displays the image of the entire region 301 on an entire region display unit 501 described later with reference to FIG. 5.

(FIG. 4: Step S402)

The user specifies any one section on the entire region display unit 501 as a first sample section on a screen shown in FIG. 5 described later. The image acquisition unit 117 acquires an image of the medium-magnification region 303 of the specified first sample section. Coordinates of the medium-magnification region 303 may be an appropriate location of the first sample section (for example, a center of gravity, or a rectangular area centered on a position specified by the user on the screen).

(FIG. 4: Step S403)

The display device 130 displays the image of the medium-magnification region 303 imaged in step S402 on a medium-magnification region display unit 502 described later with reference to FIG. 5. The position calculation unit 120 obtains coordinates of a medium-magnification region frame 601 in the entire region display unit 501 according to the coordinates of the medium-magnification region 303. The display device 130 displays the medium-magnification region frame 601 at the coordinates. An example of the medium-magnification region frame 601 will be described again with reference to FIG. 6A described later.

(FIG. 4: Step S404)

The position calculation unit 120 obtains coordinates of a high-magnification region indicator 503 (that is, the high-magnification region coordinates 305) for specifying the high-magnification region 304 in the medium-magnification region display unit 502. The display device 130 displays the high-magnification region indicator 503 at the coordinates. The user moves the high-magnification region indicator 503 in the medium-magnification region display unit 502. The position calculation unit 120 sequentially obtains the coordinates of the high-magnification region indicator 503 after the movement. A specific example of this step will be described again with reference to FIG. 6A described later.

(FIG. 4: Step S404: Supplement)

In this step, in order to make it easy to visually recognize the high-magnification region 304, a peripheral region including a region specified by the high-magnification region indicator 503 may be enlarged and displayed on an enlarged region display unit 505 described later with reference to FIG. 5.

(FIG. 4: Step S405)

The position storage unit 119 stores the high-magnification region coordinates 305. In the first embodiment, center coordinates of the high-magnification region indicator 503 are used as the high-magnification region coordinates 305, but any coordinates inside the frame, on the frame, or outside the frame may be used as long as the coordinates of the high-magnification region indicator 503 can be specified.

(FIG. 4: Step S406)

The user selects a first characteristic point of the first sample section and a second characteristic point of the first section on the entire region display unit 501. A specific example of this step will be described later with reference to FIG. 6B. This step may be performed before step S402, for example.

(FIG. 4: Step S407)

The position calculation unit 120 calculates a positional relationship among the first characteristic point and the second characteristic point specified by the user in step S406 and the high-magnification region coordinates 305 (for example, relative coordinates thereof). The position storage unit 119 stores the positional relationship.

(FIG. 4: Step S408)

The user specifies another sample on the entire region display unit 501 as a second sample section. Next, the user selects a first characteristic point of the second sample section and a second characteristic point of the second section on the entire region display unit 501. A specific example of this step will be described later with reference to FIG. 7A.

(FIG. 4: Step S409)

The position calculation unit 120 reads from the position storage unit 119 the positional relationship among the first characteristic point, the second characteristic point, and the high-magnification region coordinates 305 obtained for the first sample section in step S407.

(FIG. 4: Step S410)

The position calculation unit 120 associates coordinates of the first characteristic point of the first sample section with coordinates of the first characteristic point of the second sample section. The position calculation unit 120 further associates coordinates of the second characteristic point of the first sample section with coordinates of the second characteristic point of the second sample section. The position calculation unit 120 assumes that a correspondence relationship among the first characteristic point, the second characteristic point, and the high-magnification region coordinates 305 in the second sample section is similar to the correspondence relationship in the first sample section, and uses the similar relationship to calculate the high-magnification region coordinates 305 in the second sample section. A specific example of this step will be described later with reference to FIG. 7B.

(FIG. 4: Step S411)

The position calculation unit 120 stores the calculated high-magnification region coordinates 305 of the second sample section in the position storage unit 119.

(FIG. 4: Step S412)

The user repeats the same processing of steps S408 to S411 for a third sample section and thereafter until the high-magnification region coordinates 305 are obtained for all the sample sections.

Figure 5:
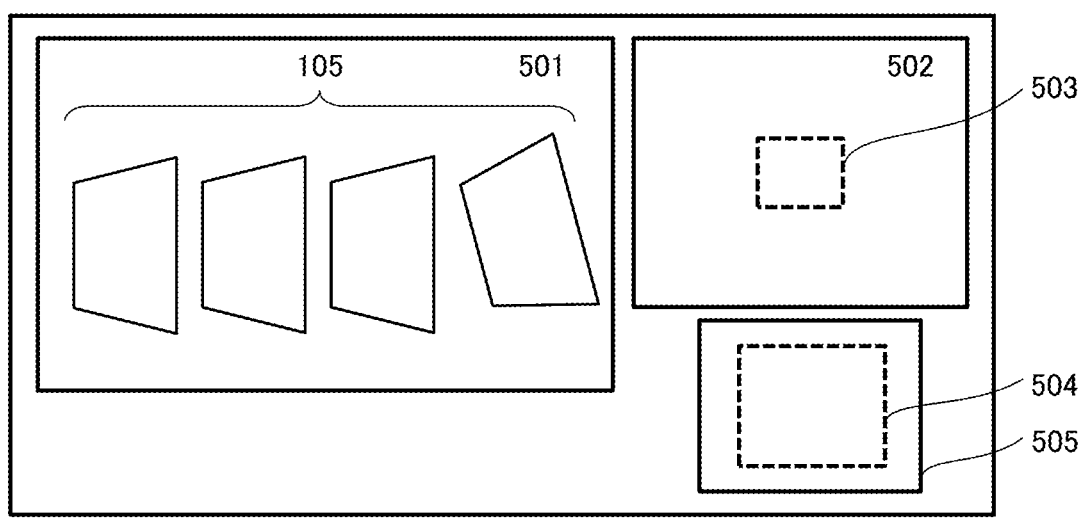
FIG. 5 is an example of a screen interface displayed by a display device 130.

FIG. 5 is an example of a screen interface displayed by the display device 130. The user uses this screen interface to input a specified input in each step of FIG. 4. The screen interface includes an entire region display unit 501, a medium-magnification region display unit 502, and an enlarged region display unit 505.

The entire region display unit 501 displays the image of the entire region 301. The entire region 301 includes a plurality of sample sections included in the continuous section sample 105. In steps S402, S406, and S408, the user can specify a first characteristic point and a second characteristic point of each section on the entire region display unit 501.

The medium-magnification region display unit 502 displays an image of the medium-magnification region 303. The medium-magnification region 303 has a function of displaying an image around the high-magnification region 304 at a lower magnification for the user to specify the high-magnification region 304 accurately. The medium-magnification region display unit 502 further displays the high-magnification region indicator 503 indicating the high-magnification region 304 specified by the user. The user specifies the high-magnification region 304 by moving the high-magnification region indicator 503 on the screen.

The enlarged region display unit 505 displays an image in which a periphery of the high-magnification region indicator 503 is enlarged at a higher magnification. When the user moves the high-magnification region indicator 503, the enlarged area display unit 505 also changes the displayed image accordingly. A high-magnification region frame 504 corresponds to the high-magnification region indicator 503.

Figure 6A:
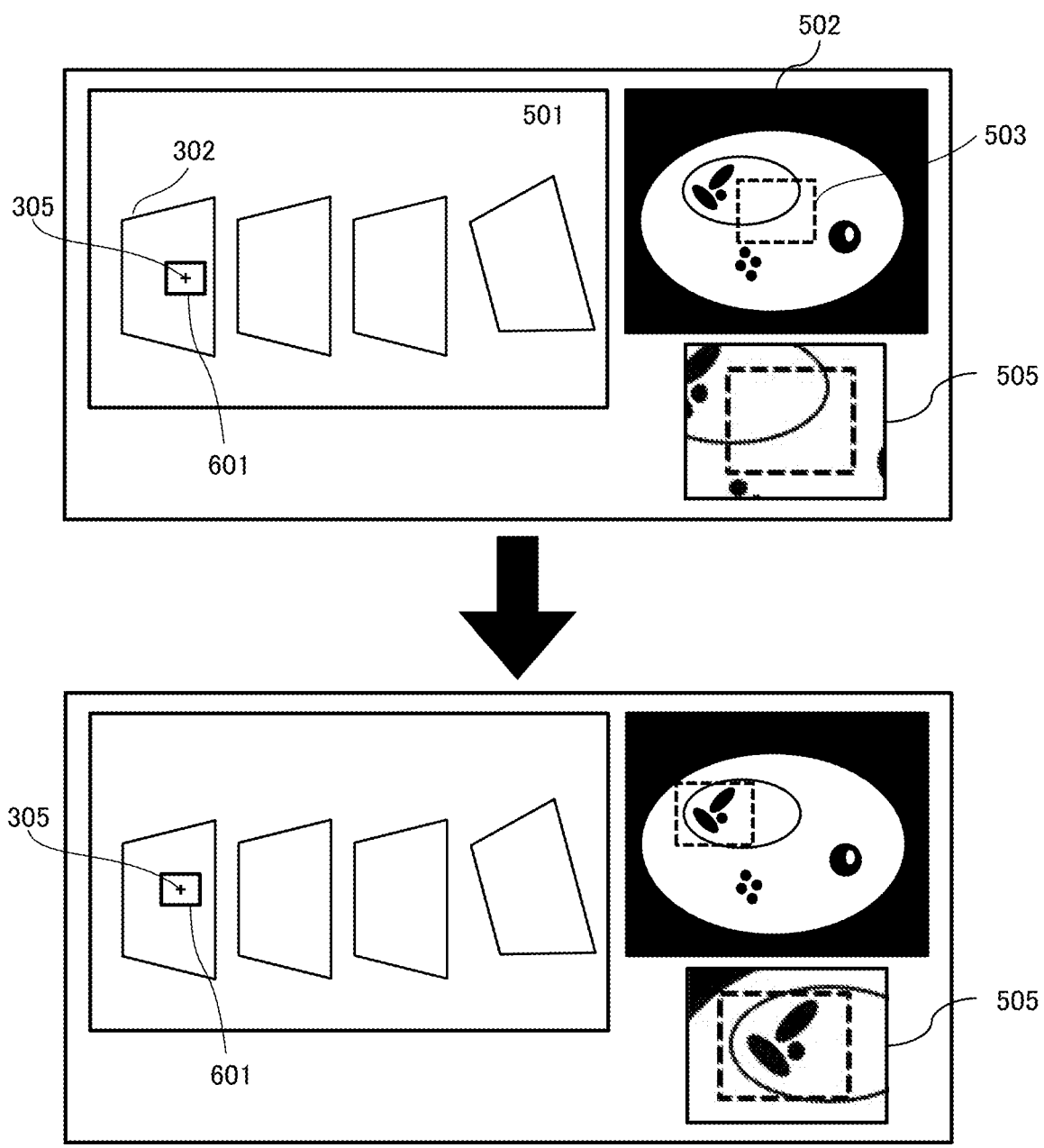
FIG. 6A is a specific example of a screen interface in step S404.

FIG. 6A is a specific example of a screen interface in step S404. When the user moves the high-magnification region indicator 503 in the medium-magnification region display unit 502, the image in the enlarged region display unit 505 also changes accordingly. Further, in order to grasp a relative position of the high-magnification regions 304 on the sample section, a position of the high-magnification region 304 may also be displayed on the entire region display unit 501. For example, a position of an image (a mark + in FIG. 6A) indicating the high-magnification region coordinates 305 may be moved along with a movement of the high-magnification region 304, or the medium-magnification region frame 601 may be moved.

Figure 6B:
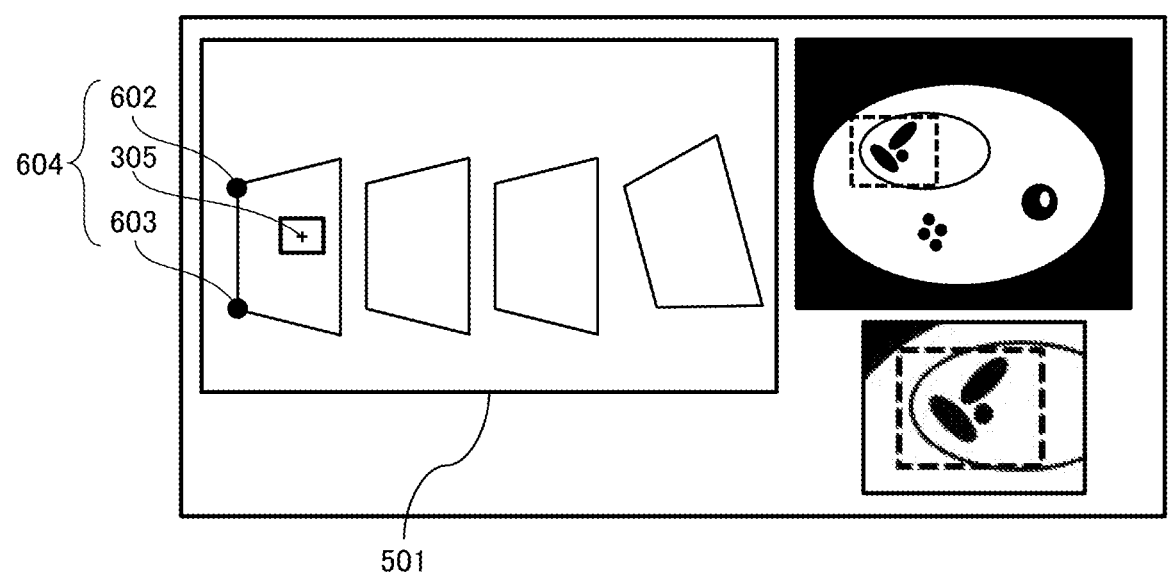
FIG. 6B is a specific example of a screen interface in step S406.

FIG. 6B is a specific example of a screen interface in step S406. The user specifies a first characteristic point 602 and a second characteristic point 603 of the first sample section on the entire region display unit 501. The position calculation unit 120 calculates a positional relationship among the first characteristic point 602, the second characteristic point 603, and the high-magnification region coordinates 305 as a positional relationship 604, and stores the positional relationship in the position storage unit 119.

Figure 7A:
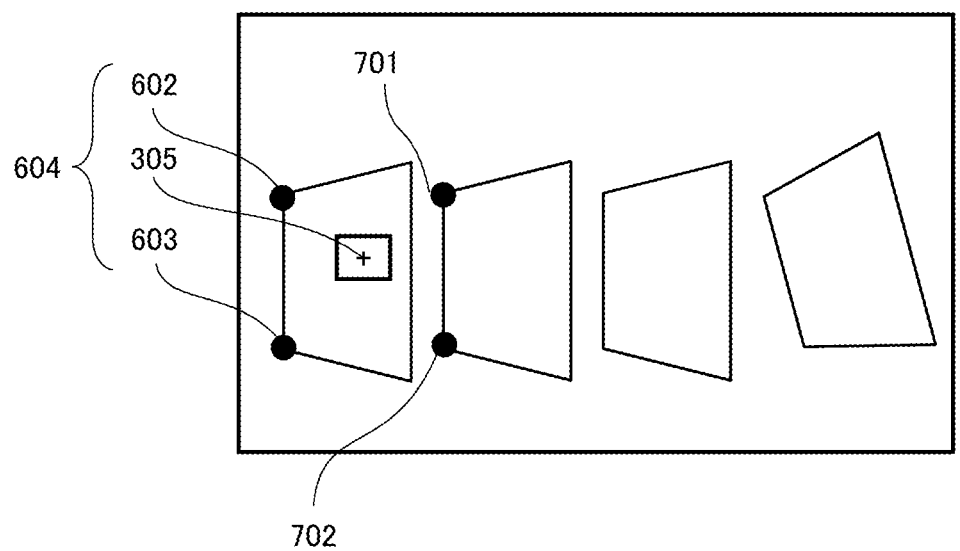
FIG. 7A is a specific example of a screen interface in step S408.

FIG. 7A is a specific example of a screen interface in step S408. The user specifies a first characteristic point 701 and a second characteristic point 702 of the second sample section on the entire region display unit 501.

Figure 7B:
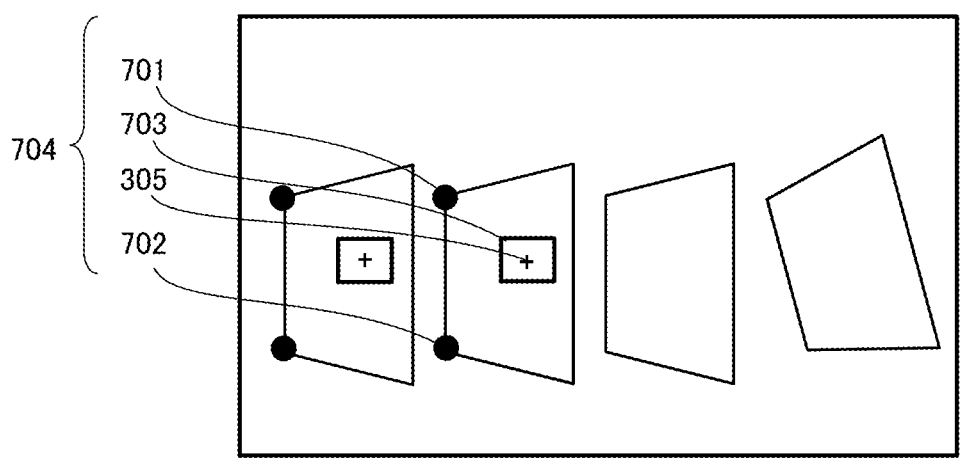
FIG. 7B is an example of a screen interface that displays a result of step S410.

FIG. 7B is an example of a screen interface that displays a result of step S410. A positional relationship in the second sample section similar to the positional relationship among the first characteristic point 602, the second characteristic point 603, and the high-magnification region coordinates 305 of the first sample section is calculated, so that the high-magnification region coordinates 305 in the second sample section can be calculated. The position calculation unit 120 sets coordinates of the first characteristic point 701, coordinates of the second characteristic point 702, and the high-magnification region coordinates 305 in the second sample section as a set, and stores the set as a registration history 704 in the position storage unit 119.

First Embodiment: Summary

The charged particle beam device 101 according to the first embodiment uses the positional relationship among the first characteristic point, the second characteristic point, and the high-magnification region coordinates 305 in the first sample section to calculate the high-magnification region coordinates 305 in another sample section. Accordingly, since the operation of specifying the high-magnification region 304 for each sample section is simplified, the user can efficiently observe the continuous section sample 105 without spending much time searching for the high-magnification region 304.

The charged particle beam device 101 according to the first embodiment can specify the high-magnification region coordinates 305 without emitting the electron beam 106 for the second sample section and thereafter. Therefore, it is possible to prevent sample damage caused by irradiating the sample with the electron beam 106 to search for the high-magnification region 304 as in the related art.

Second Embodiment

Figure 8A:
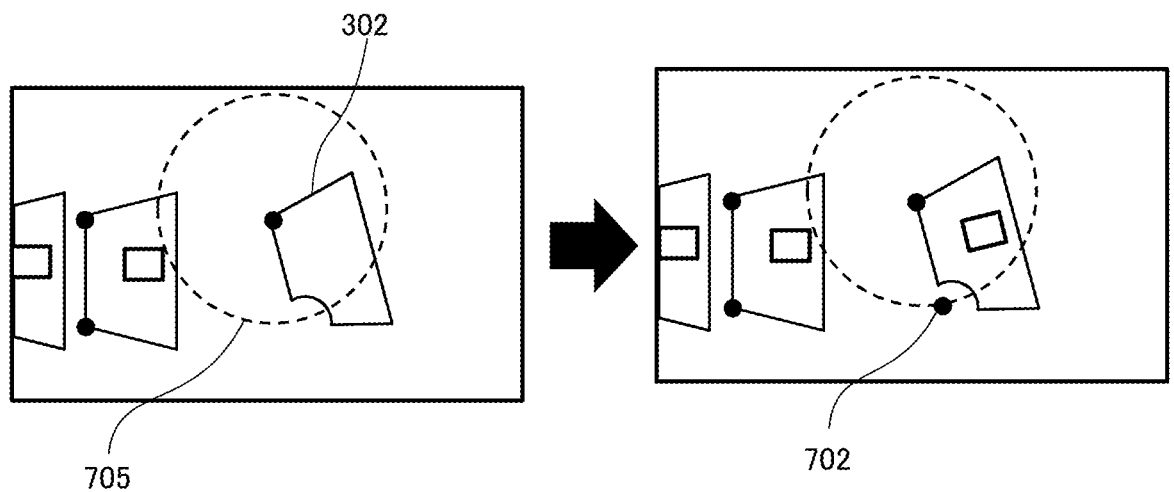
FIG. 8A is an example of a screen interface displayed by the display device 130 according to a second embodiment.

FIG. 8A is an example of a screen interface displayed by the display device 130 according to a second embodiment of the invention. Since the configuration of the charged particle beam device 101 is the same as that of the first embodiment, the following mainly describes differences regarding the screen interface shown in FIG. 8.

The position calculation unit 120 calculates a distance between the first characteristic point 602 and the second characteristic point 603 of the first sample section. When the user specifies the first characteristic point 701 of the second sample section, the position calculation unit 120 obtains a circle 705 having the first characteristic point 701 as a center and the distance calculated earlier as a radius, and causes the display device 130 to display the circle 705. When the first sample section and the second sample section have substantially the same shape and size, it can be estimated that the second characteristic point 702 exists on the circle 705. Therefore, as shown in a right diagram of FIG. 8, even when a portion on the second sample section corresponding to the second characteristic point 702 is missing, the user can specify the second characteristic point 702 with high accuracy. For example, the second characteristic point 702 can be specified as an intersection of a straight line extending from the first characteristic point 701 and the circle 705.

Figure 8B:
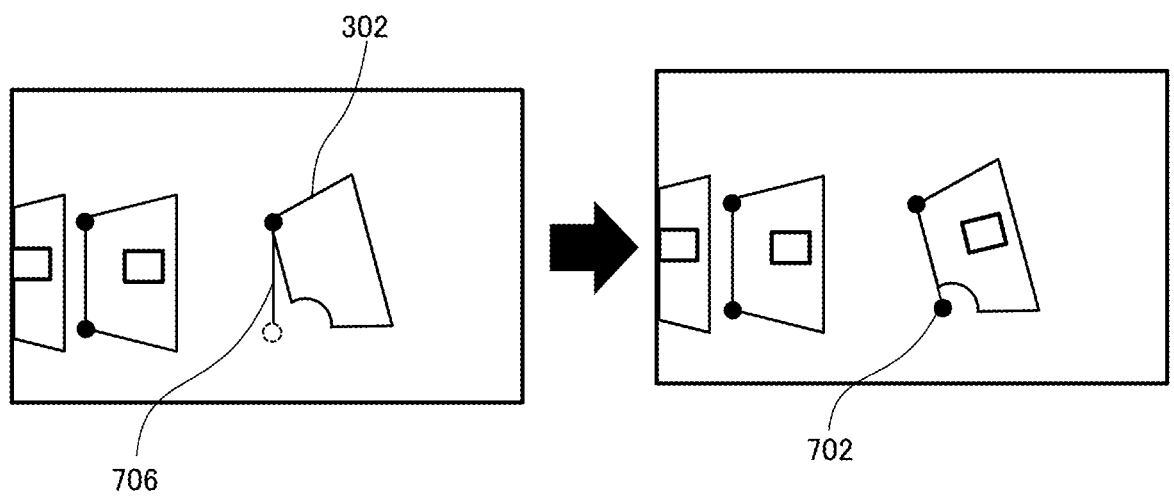
FIG. 8B is another example of a screen interface displayed by the display device 130 according to the second embodiment.

FIG. 8B is another example of a screen interface displayed by the display device 130 according to the second embodiment. The position calculation unit 120 calculates a first line segment between the first characteristic point 602 and the second characteristic point 603 of the first sample section. When the user specifies the first characteristic point 701 of the second sample section, the position calculation unit 120 obtains a second line segment 706 having the same length as the first line segment, being parallel to the first line segment, and having the first characteristic point 701 as a starting point, and causes the display device 130 to display the second line segment 706. An end of the second line segment 706 can be used as a candidate for the second characteristic point 702. By rotating the second line segment 706 having the first characteristic point 701 as the center, even in a case where a portion on the second sample section corresponding to the second characteristic point 702 is missing as shown in FIG. 8B, the user can specify the second characteristic point 702 with high accuracy.

Figure 9:
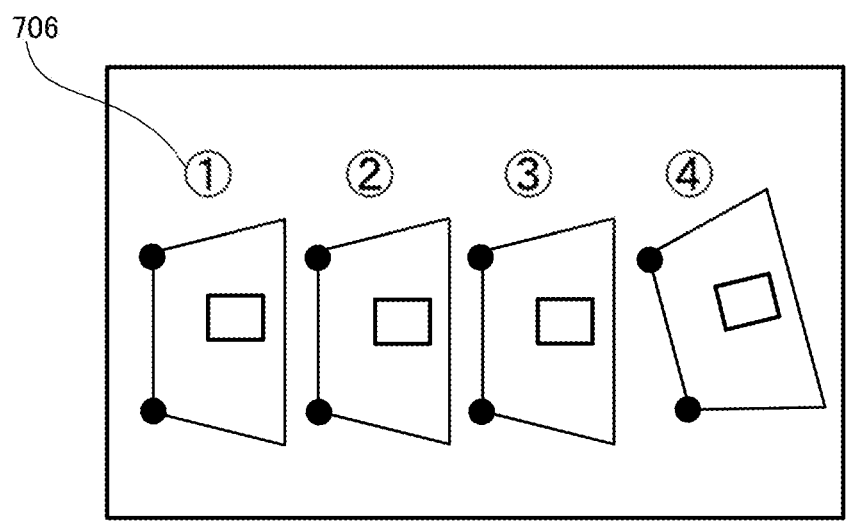
FIG. 9 is still another example of a screen interface displayed by the display device 130 according to the second embodiment.

FIG. 9 is still another example of a screen interface displayed by the display device 130 according to the second embodiment. The position calculation unit 120 may display the number 706 of the sample section on the entire region display unit 501 every time step S411 is completed. Accordingly, the sample section whose high-magnification region coordinates 305 is stored can be easily visually recognized.

Third Embodiment

Figure 10A:
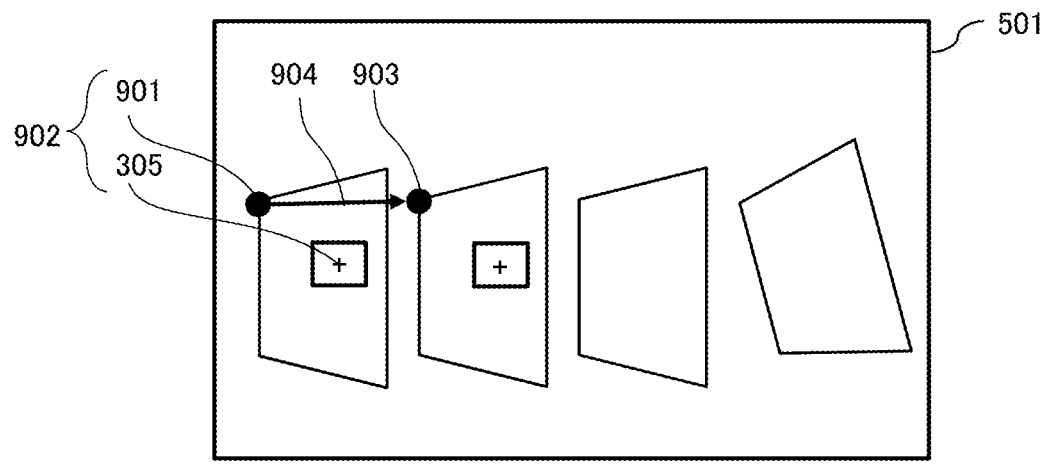
FIG. 10A is an example of a screen interface displayed by display device 130 according to a third embodiment.

FIG. 10A is an example of a screen interface displayed by display device 130 according to a third embodiment. Since the configuration of the charged particle beam device 101 is the same as that of the first embodiment, the following mainly describes differences regarding the screen interface shown in FIG. 10A.

It is considered that when the sample sections of the continuous section sample 105 are aligned in substantially the same shape and substantially the same direction, the corresponding characteristic point of each section are regularly arranged. With this fact being used in the third embodiment, a second characteristic point 903 for the second sample section is specified while specifying a first characteristic point 901 and the high-magnification region coordinates 305 for the first sample section, and an observation region of the second sample section is automatically obtained according to the correspondence relationship therebetween. The coordinates of each characteristic point can be input by the user specifying the coordinates of each point in the entire region display unit 501.

The position calculation unit 120 calculates a vector amount 904 between the first characteristic point 901 and the second characteristic point 903. In addition, the position calculation unit 120 calculates a positional relationship 902 between the first characteristic point 901 and the high-magnification region coordinates 305 in the first sample section, and the positional relationship 902 is applied to the second characteristic point 903, so that the high-magnification region coordinates 305 in the second sample section can be calculated. The position calculation unit 120 stores the position relationship 902 in the position storage unit 119.

Figure 10B:
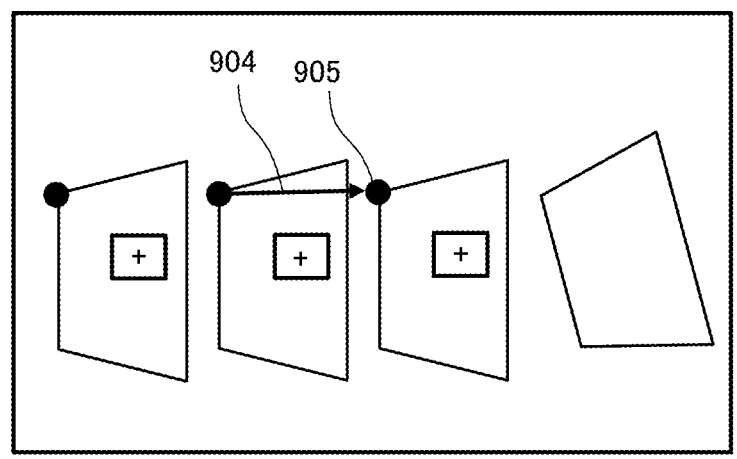
FIG. 10B is a diagram showing a processing for a third sample section.

FIG. 10B is a diagram showing a processing for the third sample section. It is considered that when each sample section is regularly arranged, the positional relationship between the first characteristic point 901 and the second characteristic point 903 is also maintained between the second characteristic point 903 of the second sample section and a third characteristic point 905 of the third sample section. Using this relationship, the position calculation unit 120 calculates coordinates of the third characteristic point 905 by applying the vector amount 904 to the second characteristic point 903. Therefore, the user does not need to specify the coordinates of the third characteristic point 905.

The position calculation unit 120 can further calculate the high-magnification region coordinates 305 in the third sample section by applying the positional relationship 902 to the third characteristic point 905. Therefore, the user does not need to specify the high-magnification region coordinates 305. Similarly, coordinates of a fourth sample section and thereafter can be calculated without specifying characteristic points and high-magnification region coordinates 305. The case where the arrangement is slightly shifted, such as sample sections in right sides of FIGS. 10A and 10B, will be described later.

Figure 11:
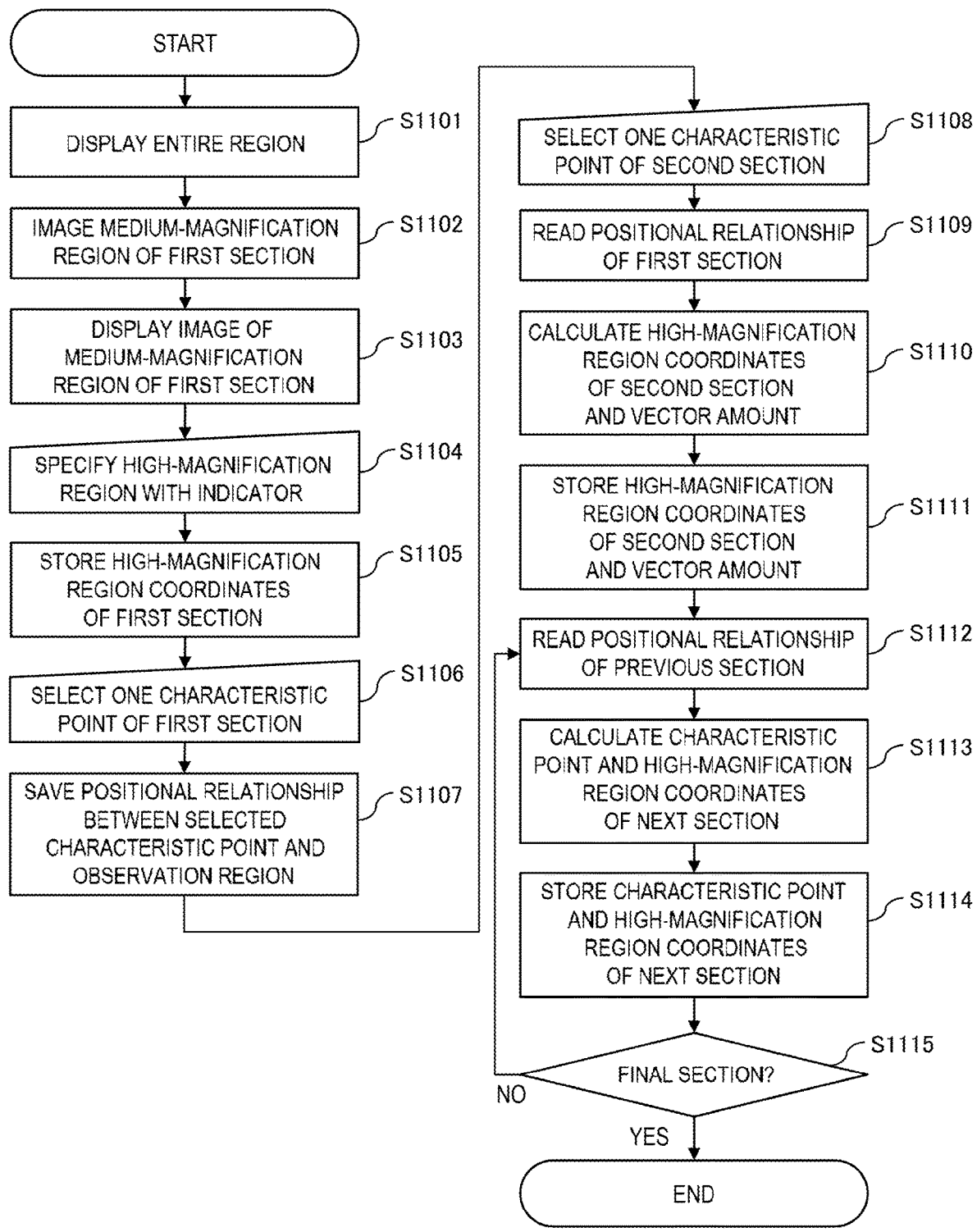
FIG. 11 is a flowchart showing details of step S203 according to the third embodiment.

FIG. 11 is a flowchart showing details of step S203 according to the third embodiment. Hereinafter, each step of FIG. 11 will be described.

(FIG. 11: Steps S1101 to S1107)

These steps are the same as steps S401 to S407. However, in step S1106, the user specifies the first characteristic point 901 of the first sample section as described with reference to FIG. 10A. Further, in step S1107, the position calculation unit 120 obtains the positional relationship 902, and stores the positional relationship in the position storage unit 119.

(FIG. 11: Steps S1108 to S1111)

The user specifies the second characteristic point 903 of the second sample section as described with reference to FIG. 10A (S1108). The position calculation unit 120 reads the positional relationship 902 from the position storage unit 119 (S1109). The position calculation unit 120 calculates the vector amount 904 described with reference to FIG. 10A, and calculates the high-magnification region coordinates 305 of the second sample section (S1110). The position calculation unit 120 stores the vector amount 904 and the high-magnification region coordinates 305 of the second sample section in the position storage unit 119 (S1111).

(FIG. 11: Step S1112)

The position calculation unit 120 can repeatedly use the positional relationship between the first characteristic point 901 and the high-magnification region coordinates 305 in the first sample section for the third sample section and thereafter, and the positional relationship between the characteristic point and the high-magnification region coordinates 305 in a previous sample section can also be sequentially applied to the next sample section. In this flowchart, it is assumed that the latter is used. In this case, the position calculation unit 120 acquires a positional relationship between the second characteristic point 903 and the high-magnification region coordinates 305 in the second sample section.

(FIG. 11: Step S1113)

The position calculation unit 120 obtains the coordinates of the third characteristic point 905 in the third sample section by applying the vector amount 904 to the second characteristic point 903. By applying the positional relationship between the second characteristic point 903 and the high-magnification region coordinates 305 in the second sample section to the third characteristic point 905, the position calculation unit 120 calculates the high-magnification region coordinates 305 in the third sample section.

(FIG. 11: Step S1113: Supplement No. 1)

For example, when the third sample section is arranged with a slight shift, if the vector amount 904 is applied to the second characteristic point 903, coordinates of a position slightly shifted from the third characteristic point 905 are obtained. Even in such a case, in order to accurately acquire the coordinates of the third characteristic point 905, the position calculation unit 120 may search for the third characteristic point 905 by an appropriate method such as pattern matching. For example, when the user specifies the second characteristic point 903, an image of periphery around the second characteristic point 903 is stored in the position storage unit 119 in advance as a reference pattern. The position calculation unit 120 searches for a partial region that matches the reference pattern in the periphery around the coordinates obtained by applying the vector amount 904 to the second characteristic point 903. Accordingly, the third characteristic point 905 can be accurately specified.

(FIG. 11: Step S1113: Supplement No. 2)

The position calculation unit 120 compares an image of the periphery around coordinates obtained by applying the vector amount 904 to the second characteristic point 903 with the reference pattern, and when the coordinates match the reference pattern, adopts the point as the third characteristic point 905 as it is. When the coordinates do not match the reference pattern, a reference pattern in a peripheral region may be further searched for, or a message prompting the user to specify the third characteristic point 905 may be displayed.

(FIG. 11: Step S1114)

The position calculation unit 120 stores the calculated high-magnification region coordinates 305 of the third sample section in the position storage unit 119.

(FIG. 11: Step S1115)

The user repeats the same processing as steps S1112 to S1114 for the fourth sample section and thereafter until the high-magnification region coordinates 305 are obtained for all the sample sections.

Third Embodiment: Summary

The charged particle beam device 101 according to the third embodiment repeatedly applies the correspondence relationship between the first characteristic point 901 and the high-magnification region coordinates 305 in the first sample section to the second sample section and thereafter based on the vector amount 904, so as to automatically calculate characteristic points and the high-magnification region coordinates 305 in each sample section. Accordingly, particularly when the sample sections are sufficiently aligned, a work load for the user to specify the characteristic point or the like can be reduced.

Modification Example of Invention

The invention is not limited to the embodiments described above, and includes various modification examples. For example, the above-described embodiments have been described in detail for easy understanding of the invention, and are not necessarily limited to those having all the configurations described above. In addition, a part of the configuration of one embodiment can be replaced with the configuration of another embodiment, and the configuration of one embodiment can be added to the configuration of another embodiment. It is possible to add, delete, and replace other configurations for a part of the configuration of each embodiment.

In the first embodiment, the high-magnification region coordinates 305 in each sample section are calculated using the positional relationship among the two characteristic points and the high-magnification region coordinates 305 in the first sample section. The number of characteristic points is not limited to two as long as the high-magnification region coordinates 305 can be obtained. Similarly, in the third embodiment, two or more characteristic points may be specified for the sample section, and the positional relationship between the characteristic points may be repeatedly applied for the second sample section and thereafter according to the vector amount 904.

In the first and second embodiments, the charged particle beam device 101 is described as operating as an imaging device by being configured as a scanning electron microscope, whereas the invention can be similarly applied to a case where another charged particle beam device such as a focused ion beam (FIB) device or a transmission electron microscope operates as the imaging device. The invention can be similarly applied to an imaging device such as a confocal laser microscope and a fluorescence microscope.

In the above embodiments, images of the medium-magnification region 303 may be displayed in the entire region display unit 501 instead of or in combination with the medium-magnification region display unit 502. For example, the image of the medium-magnification region 303 may be reduced and displayed in the medium-magnification region frame 601 in FIG. 6A.

In the above embodiment, although a living tissue is shown as the continuous section sample 105, an imaging efficiency can be significantly improved by applying the technology to other samples in which a plurality of samples having similar structures is arranged.

REFERENCE SIGN LIST

101: charged particle beam device
102: lens barrel
103: sample chamber
104: device main body
105: continuous section sample
106: electron beam
107: electron gun
108: electron optical system
109: condenser lens
110: deflector
111: objective lens
112: sample table
113: signal
114: detector
115: sample stage
116: stage control device
117: image acquisition unit
118: position input unit
119: position storage unit
120: position calculation unit
121: stage control unit
122: optical system control unit

The invention claimed is:

1. An imaging device configured to capture an image of a sample including a plurality of sections, the imaging device comprising:
   an imaging unit configured to generate an image signal indicating an image of the sample;
   a controller configured to generate the image of the sample using the image signal; and
   an interface configured to receive a specified input specifying coordinates in the image, wherein
   the interface receives the specified input specifying coordinates of a first characteristic point of a first sample section, and coordinates of a first observation region which is a partial region of the first sample section in the image,
   the interface further receives the specified input specifying coordinates of a second characteristic point of a second sample section in the image,
   the controller calculates, according to a first correspondence relationship between the coordinates of the first characteristic point and the first observation region, a second correspondence relationship between coordinates of the second characteristic point and coordinates of a second observation region which is a partial region of the second sample section,
   the controller specifies the coordinates of the second observation region according to the second correspondence relationship, and
   the imaging unit captures the specified second observation region.

2. The imaging device according to claim 1, wherein
   the interface further receives the specified input specifying coordinates of a third characteristic point of the first sample section and coordinates of a fourth characteristic point of the second sample section in the image,
   the controller calculates, according to a third correspondence relationship among the coordinates of the first characteristic point, the coordinates of the third characteristic point, and the first observation region, a fourth correspondence relationship among the coordinates of the second characteristic point, the coordinates of the fourth characteristic point, and the coordinates of the second observation region,
   the controller specifies the coordinates of the second observation region according to the fourth correspondence relationship, and
   the imaging unit captures the specified second observation region.

3. The imaging device according to claim 2, further comprising:
   a display unit configured to display the image, wherein
   the controller estimates, based on a correspondence relationship between the coordinates of the first characteristic point and the coordinates of the third characteristic point, relative coordinates of the fourth characteristic point with respect to the coordinates of the second characteristic point, and
   the display unit displays an image indicating the relative coordinates of the fourth characteristic point estimated by the controller.

4. An imaging device configured to capture an image of a sample including a plurality of sections, the imaging device comprising:
   an imaging unit configured to generate an image signal indicating an image of the sample;

a controller configured to generate the image of the sample using the image signal;
an interface configured to receive a specified input specifying coordinates in the image; and
a display unit configured to display the image, wherein
the interface receives the specified input specifying coordinates of a first characteristic point of a first sample section, and coordinates of a first observation region which is a partial region of the first sample section in the image,
the interface further receives the specified input specifying coordinates of a third characteristic point of the first sample section and coordinates of a second characteristic point of a second sample section in the image,
the controller obtains a distance between the coordinates of the first characteristic point and the coordinates of the third characteristic point, and obtains an arc having the coordinates of the second characteristic point as a center, and having the distance as a radius, and
the display unit displays, as an image indicating relative coordinates of a fourth characteristic point of the second sample section, the arc having the coordinates of the second characteristic point as the center which is obtained by the controller.

5. An imaging device configured to capture an image of a sample including a plurality of sections, the imaging device comprising:
an imaging unit configured to generate an image signal indicating an image of the sample;
a controller configured to generate the image of the sample using the image signal;
an interface configured to receive a specified input specifying coordinates in the image; and
a display unit configured to display the image, wherein
the interface receives the specified input specifying coordinates of a first characteristic point of a first sample section, and coordinates of a first observation region which is a partial region of the first sample section in the image,
the interface further receives the specified input specifying coordinates of a third characteristic point of the first sample section and coordinates of a second characteristic point of a second sample section in the image,
the controller obtains a first line segment between the coordinates of the first characteristic point and the coordinates of the third characteristic point,
the controller obtains a second line segment starting from the coordinates of the second characteristic point, having a length equal to a length of the first line segment and being parallel to the first line segment, and
the display unit displays the second line segment obtained by the controller as an image indicating relative coordinates of a fourth characteristic point of the second sample section.

6. The imaging device according to claim 2, wherein
the controller calculates, according to a fifth correspondence relationship between the first characteristic point and the second characteristic point, a sixth correspondence relationship between the second characteristic point and a fifth characteristic point of a third sample section, and
the controller estimates coordinates of the fifth characteristic point according to the sixth correspondence relationship.

7. The imaging device according to claim 6, wherein
the controller calculates, according to the first correspondence relationship and the sixth correspondence relationship, a seventh correspondence relationship between coordinates of the fifth characteristic point and coordinates of a third observation region which is a partial region of the third sample section,
the controller specifies the coordinates of the third observation region according to the seventh correspondence relationship, and
the imaging unit captures the specified third observation region.

8. The imaging device according to claim 1, further comprising:
a sample table on which the sample is placed; and
a stage controlled by the controller to move the sample table, wherein
the controller moves the stage according to the coordinates of the specified second observation region.

9. The imaging device according to claim 1, wherein
the imaging unit generates, as the image signal,
a first image signal including an image of the first sample section and an image of the second sample section, and
a second image signal having a higher magnification than the first image signal and indicating an image of the partial region of the first sample section,
the controller uses the first image signal to generate a first image including the image of the first sample section and the image of the second sample section, and
the controller uses the second image signal to generate a second image of the partial region of the first sample section.

10. The imaging device according to claim 1, further comprising:
a display unit configured to display the image, wherein
the display unit displays a first identifier identifying the first sample section, and a second identifier identifying the second sample section.

11. The imaging device according to claim 2, wherein
the controller specifies the coordinates of the second observation region by calculating a second geometrical positional relationship among the coordinates of the second characteristic point, the coordinates of the fourth characteristic point, and the second observation region, the second geometrical positional relationship being similar to a first geometric positional relationship among the coordinates of the first characteristic point, the coordinates of the third characteristic point, and the coordinates of the first observation region.

12. The imaging device according to claim 1, further comprising:
a display unit configured to display the image, wherein
the display unit displays an image indicating the coordinates of the first characteristic point, an image indicating the coordinates of the first observation region, an image indicating the coordinates of the second characteristic point, and an image indicating coordinates of the second observation region.

13. The imaging device according to claim 1, wherein
the imaging unit includes:
an emitting unit configured to emit a charged particle beam to the sample; and
a detector configured to detect an electron generated by the charged particle beam colliding with the sample, wherein
the detector outputs a signal indicating an intensity of the detected electron as the image signal.

14. The imaging device according to claim 4, wherein
the interface further receives the specified input specifying coordinates of the fourth characteristic point of the second sample section in the image,
the controller calculates, according to a third correspondence relationship among the coordinates of the first characteristic point, the coordinates of the third characteristic point, and the first observation region, a fourth correspondence relationship among the coordinates of the second characteristic point, the coordinates of the fourth characteristic point, and the coordinates of the second observation region which is a partial region of the second sample section,
the controller specifies the coordinates of the second observation region according to the fourth correspondence relationship, and
the imaging unit captures the specified second observation region.

15. The imaging device according to claim 14, further comprising: a sample table on which the sample is placed; and
a stage controlled by the controller to move the sample table, wherein
the controller moves the stage according to the coordinates of the specified second observation region.

16. The imaging device according to claim 5, wherein
the interface further receives the specified input specifying coordinates of the fourth characteristic point of the second sample section in the image,
the controller calculates, according to a third correspondence relationship among the coordinates of the first characteristic point, the coordinates of the third characteristic point, and the first observation region, a fourth correspondence relationship among the coordinates of the second characteristic point, the coordinates of the fourth characteristic point, and the coordinates of the second observation region which is a partial region of the second sample section,
the controller specifies the coordinates of the second observation region according to the fourth correspondence relationship, and
the imaging unit captures the specified second observation region.

17. The imaging device according to claim 16, further comprising:
a sample table on which the sample is placed; and
a stage controlled by the controller to move the sample table, wherein
the controller moves the stage according to the coordinates of the specified second observation region.

* * * * *